United States Patent [19]

Miyata et al.

[11] Patent Number: 5,086,014
[45] Date of Patent: Feb. 4, 1992

[54] SCHOTTKY DIODE MANUFACTURING PROCESS EMPLOYING THE SYNTHESIS OF A POLYCRYSTALLINE DIAMOND THIN FILM

[75] Inventors: Koichi Miyata, Raleigh, N.C.; Kazuo Kumagai, Kobe, Japan; Koji Kobashi, Nishinomiya, Japan; Yuichi Matsui, Kobe, Japan; Akimitsu Nakaue, Kobe, Japan

[73] Assignee: Kabushiki Kaisha Kobe Seiko Sho, Kobe, Japan

[21] Appl. No.: 584,110

[22] Filed: Sep. 18, 1990

[30] Foreign Application Priority Data

Sep. 19, 1989 [JP] Japan ............................. 1-244399

[51] Int. Cl.$^5$ ............................................. H01L 21/20
[52] U.S. Cl. ........................... 437/103; 437/175; 437/179; 437/904; 427/248.1; 427/249; 427/255.2; 148/DIG. 140
[58] Field of Search ............... 427/248.1, 249, 255, 427/255.1, 255.2, 255.3; 437/41, 912, 103, 102, 175, 179, 904, 905, 906; 148/DIG. 139, DIG. 140

[56] References Cited

U.S. PATENT DOCUMENTS 4,925,701  5/1990  Jansen et al. .......................... 427/38

OTHER PUBLICATIONS

Fujimori et al., "Characterization of Conducting Diamond Films", Vacuum, vol. 36, Nos. 1-3, 1986, pp. 99-102.

Geis et al., "High-Temperature Point-Contact Transistors and Schottky Diodes Formed on Synthetic Boron-Doped Diamond", IEEE Electron Device Letters, vol. EDL-8, No. 8, Aug. 1987, pp. 341-343.

Bazhenov et al., "Synthetic Diamons in Electronics (review)", Sov. Phys. Semicond., vol. 19, No. 8, Aug. 1985, pp. 829-841.

Glover, "The C-V Characteristics of Schottky Barriers on Laboratory Grown Semiconducting Diamonds", Solid State Electronics, 1973, vol. 16, pp. 973-983.

Moazed et al., "Ohmic Contacts to Semiconducting Diamond", Appl. Phys. Lett., vol. 41, No. 10, p. 950, 1982.

Sze, *Physics of Semiconductor Devices*, Bell Labs, Inc., 1981, pp. 305-307.

*Primary Examiner*—Olik Chaudhuri
*Assistant Examiner*—M. Wilczewski
*Attorney, Agent, or Firm*—Oblon, Spivak, McClelland, Maier & Neustadt

[57] ABSTRACT

A schottky diode manufacturing process employing diamond film comprises forming a B-doped p-type polycrystalline diamond film on a low-resistance p-type Si substrate by CVD using a source gas consisting of $CH_4$, $H_2$ and $B_2H_6$, forming an ohmic contact on the back of the p-type Si substrate, and forming a metal electrode of Al, Pt Au, Ti or W on the B-doped p-type polycrystalline diamond film. The B/C concentration ratio of the source gas is greater than 0.01 ppm and less than 20 ppm.

5 Claims, 5 Drawing Sheets (CO/H2)

(CH4/H2)

SCHOTTKY DIODE MANUFACTURING PROCESS EMPLOYING THE SYNTHESIS OF A POLYCRYSTALLINE DIAMOND THIN FILM

BACKGROUND OF THE INVENTION

1. Field of the Invention

The present invention relates to a process of manufacturing electronic devices, particularly, Schottky diodes, employing vapor-phase diamond synthesis.

2. Description of the Prior Art

In forming a diamond film through vapor-phase synthesis, a boron-doped (B-doped) p-type diamond film is obtained by doping with boron, i.e., a metallic element of group III. B-doped p-type diamond films are expected to form Schottky diodes having excellent heat and radiation resistance, which has never been achieved by conventional Schottky diodes produced with Si and GaAs. It is also expected that other electronic devices having excellent characteristics can be fabricated using diamond films.

A Schottky diode has been reported, as shown in FIG. 6, in 1989-nen Shunki Oyo Butsuri Gakkai Yokoshu, 2a-N-7 No. 2. This Schottky diode is formed by depositing a B-doped p-type polycrystalline diamond film a on a p-type Si substrate b (the diamond film was prepared using diborane ($B_2H_6$) and a 5% CO gas diluted by $H_2$). On the back side of the Si substrate, an In electrode c which has an ohmic characteristic. An Al needle electrode d is placed on the B-doped p-type polycrystalline diamond film a. This point contact electrode is a Schottky characteristic. As shown in FIG. 7, this Schottky diode prevents a flow of electric current when a positive voltage is applied to the Al needle electrode d, whereas it permits a flow of electric current, when a negative voltage is applied to the Al needle.

The aforementioned paper also reports that a device employing a p-type semiconductor diamond film deposited using a source gas of $B_2H_6$ and a 0.5% $CH_4$ diluted by $H_2$ exhibits a current-to-voltage (I-V) characteristic as shown in FIG. 8 and does not have Schottky characteristics.

A study of a Schottky diode shown in FIG. 9 has been reported in Journal of Applied Physics, Vol. 65, No. 5, pp. 2139-2414 (1989). This Schottky diode is formed by depositing a polycrystalline diamond film a' on a p-type (100)Si substrate b' having a resistivity in the range of 0.01 to 0.1 $\Omega$.cm (the diamond film was prepared by a microwave plasma CVD process using $CH_4$ diluted by $H_2$ as a source gas). An ohmic contact electrode c' is attached on the backside of the substrate, and an Au electrode d' of a diameter of 0.1 cm and a thickness in the range of 140 to 500 Å is deposited on the polycrystalline diamond film a'. The I-V characteristic is shown in FIG. 10.

SUMMARY OF THE INVENTION

The present invention has developed as a Schottky diode having excellent characteristics by applying polycrystalline diamond film synthesis techniques in addition to the prior art. It has been found that a satisfactory Schottky diode can be produced using a B-doped diamond film synthesized by a $B_2H_4$-$CH_4$-$H_2$ gas mixture when the $B_2H_4$ concentration in the gas mixture is within a certain range, as described below:

In one aspect of the present invention, a Schottky diode manufacturing process using a polycrystalline diamond film comprises: a deposition of a B-doped p-type polycrystalline diamond film on a low-resistance p-type Si substrate by using a source gas consisting of $CH_4$, $H_2$ and $B_2H_6$ and having a boron/carbon concentration ratio greater than 0.01 ppm and less than 20 ppm; a formation of an ohmic contact on the p-type Si substrate; and a formation a metal electrode of Al Pt, Au, Ti or W on the diamond film.

When the B/C concentration ratio is 20 ppm or higher, the Schottky diode has rather an ohmic I-V characteristic and has no rectifying property. When the B/C concentration ratio is less than 0.01 ppm, the carrier density is on the order of $10^{15}/cm^2$, and hence the diamond film does not have the characteristics of p-type semiconductor.

It is inferred from FIG. 8 that the p-type polycrystalline diamond film formed by the conventional techniques using a $CH_4$ gas as a source gas did not exhibit Schottky characteristics because of an excessively high B/C concentration ratio of the source gas.

BRIEF DESCRIPTION OF THE DRAWINGS

The above and other objects, features and advantages of the present invention will become more apparent form the following description taken in connection with the accompanying drawings in which.

DETAILED DESCRIPTION OF THE PREFERRED EMBODIMENTS

Figure 1:
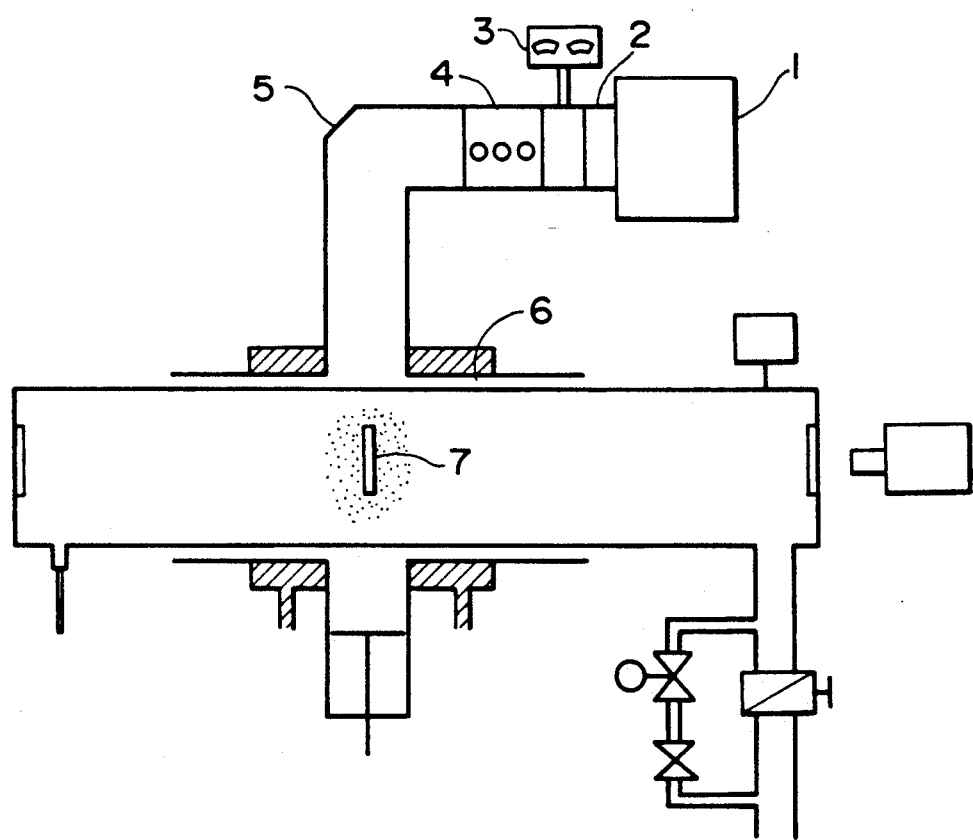
FIG. 1 is a schematic view of a vapor-phase diamond synthesizing apparatus employed for carrying out a Schottky diode manufacturing process embodying the present invention.

A Schottky diode manufacturing process in accordance with the present invention is carried out, by way of example, by a microwave plasma CVD apparatus shown in FIG. 1. In this apparatus, the microwave generated by a microwave power source 1 is transferred through an isolator 2, a power monitor 3 and a tuner 4 and a waveguide 5 into a reaction chamber 6 defined by a quartz tube penetrating perpendicularly through the waveguide 5. A substrate 7 is placed within the reaction chamber 6 at the intersection of the waveguide and the reaction chamber 6. A $CH_4$-$H_2$ gas mixture is introduced into the reaction chamber 6 and the microwave is applied to the $CH_4$-$H_2$ gas to generate a plasma around the substrate 7, whereby a polycrystalline diamond film is formed on the substrate 7.

EXAMPLE

A Schottky diode was manufactured by the Schottky diode manufacturing method of the present invention.

(i) A low-resistance p-type Si wafer with a resistivity in the range of 1 to 10 $\Omega$.cm was buff-polished for one hour using a 0.25 $\mu$m diamond paste. A substrate 7 of 20 mm $\times$ 10 mm was then cut out from the polished wafer.

(ii) A microwave plasma CVD apparatus as shown in FIG. 1 was used to deposit a polycrystalline diamond film on the substrate 7.

A source gas of 0.5% $CH_4$-$H_2$ containing $B_2H_6$ (the B/C ratio was 2 ppm) was used. The experimental conditions of the microwave plasma CVD were: the gas flow rate: 100 cc/min the pressure: 31.5 torr, strate temperature: 800° C., and the processing time: 7 hr.

Figure 2:
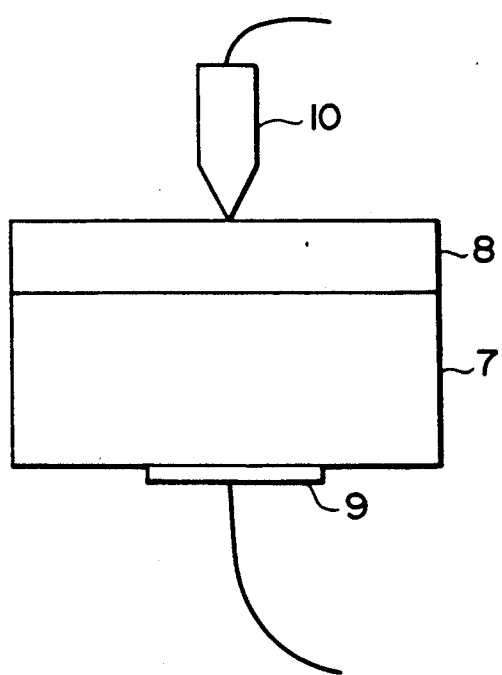
FIG. 2 is a cross sectional view of an example of a Schottky diode manufactured by the Schottky diode manufacturing process in accordance with the present invention.

As a result, p-type polycrystalline diamond film 8 of 2 $\mu$m thick was formed on the substrate 7 as shown in FIG. 2.

(iii) A 3 mm square chip was cut out from the substrate 7 which was coated by a p-type polycrystalline diamond film 8. An ohmic contact 9 was formed on the backside of the low-resistance p-type Si substrate 7 by a silver paste, and a Schottky contact was formed on the diamond film 8 by attaching an Al needle electrode 10.

Figure 3:
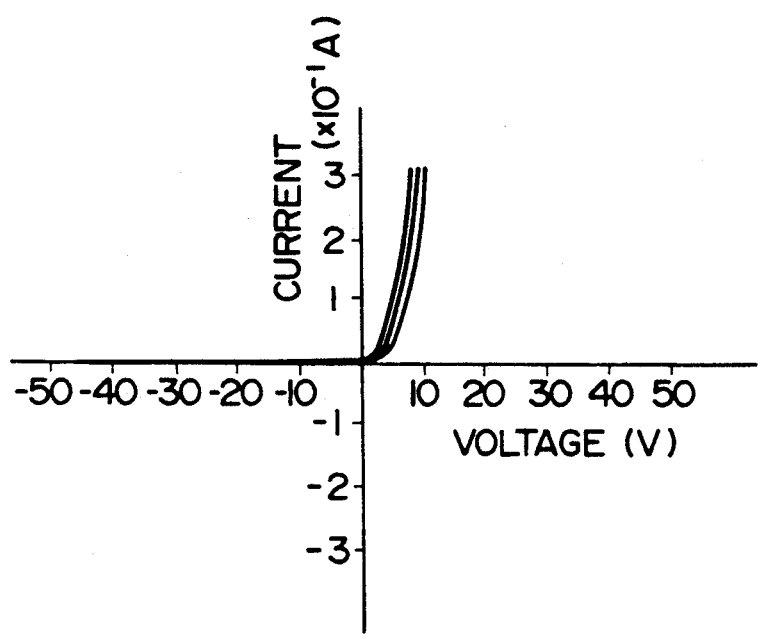
FIG. 3 is a graph showing the I-V characteristic of the Schottky diode of FIG. 2.

(iv) The measured I-V characteristic of the Schottky diode is shown in FIG. 3. The Schottky diode prevented the flow of electric current when positive voltage is applied to the Al needle electrode 10 and permitted current to flow when negative voltage is applied to the Al needle electrode 10. The Schottky characteristic of the Schottky diode was found to be satisfactory.

Figure 4:
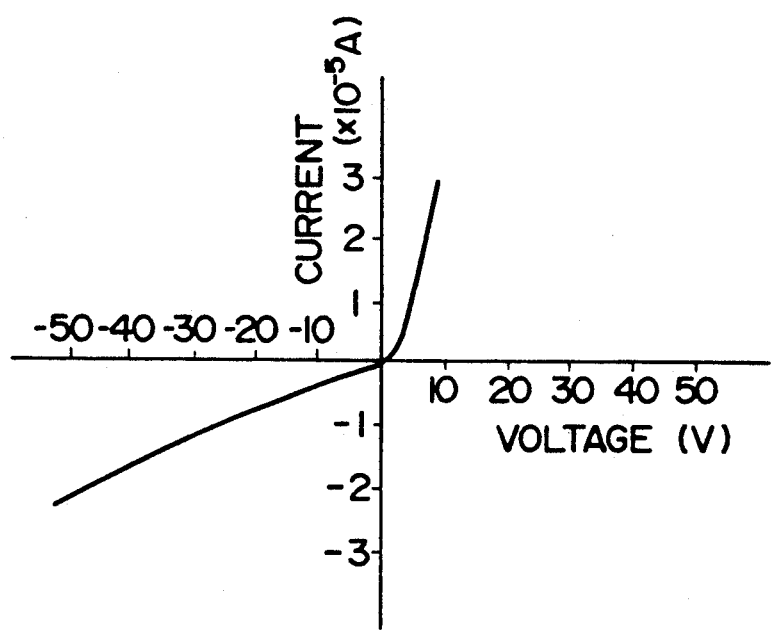
FIG. 4 is a graph showing the I-V characteristic of a Schottky diode as a control.

A Schottky diode manufactured as a control by using a source gas containing $B_2H_6$ of a B/C ratio greater than 20 ppm did not have Schottky characteristic as shown in FIG. 4.

Figure 5:
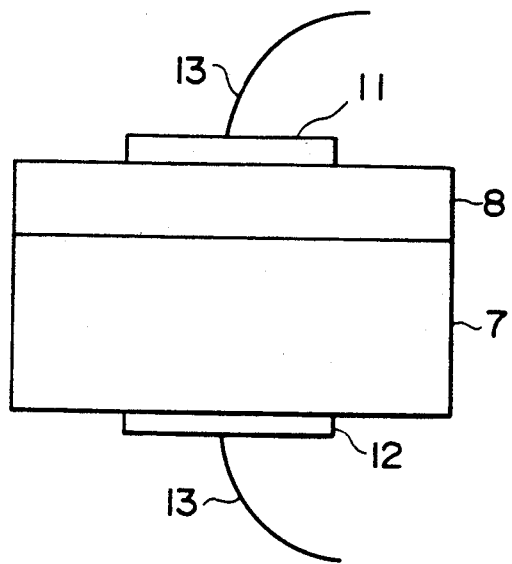
FIG. 5 is a cross sectional view of another Schottky diode manufactured by the Schottky diode manufacturing process in accordance with the present invention.
Figure 6:
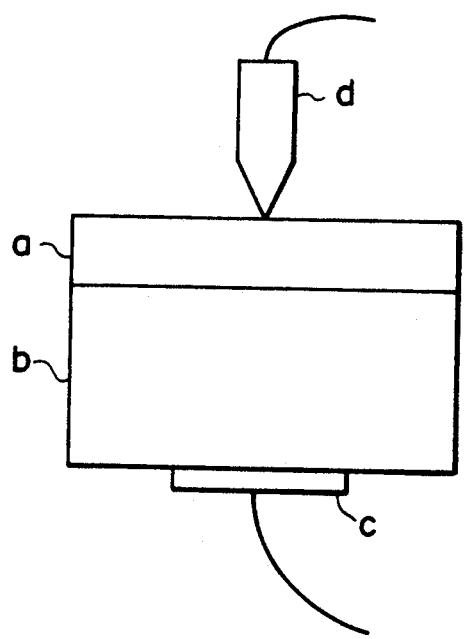
FIG. 6 is a cross sectional view of a conventional Schottky diode.
Figure 7:
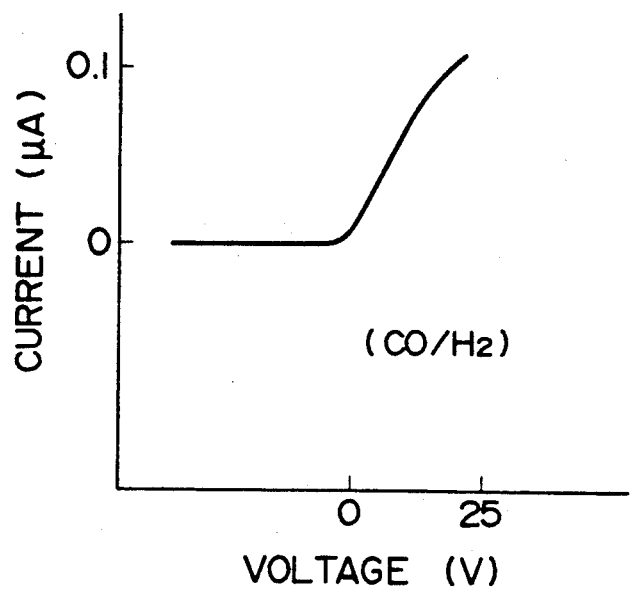
FIG. 7 is a graph showing the I-V characteristic of the Schottky diode of FIG. 6.
Figure 8:
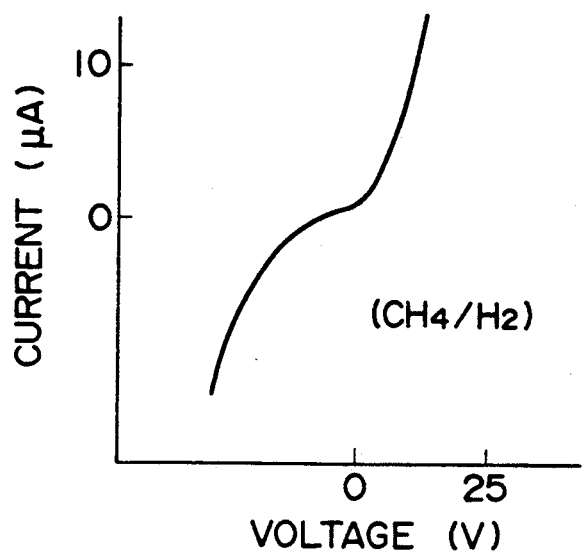
FIG. 8 is a graph showing the I-V characteristic of a conventional Schottky diode for comparison.
Figure 9:
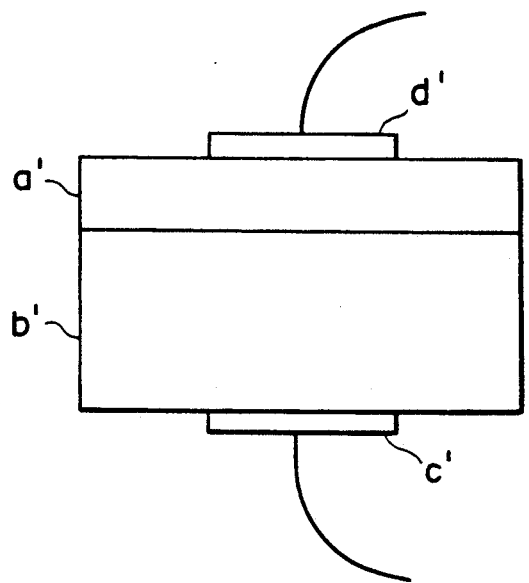
FIG. 9 is a cross sectional view of another conventional Schottky diode.
Figure 10:
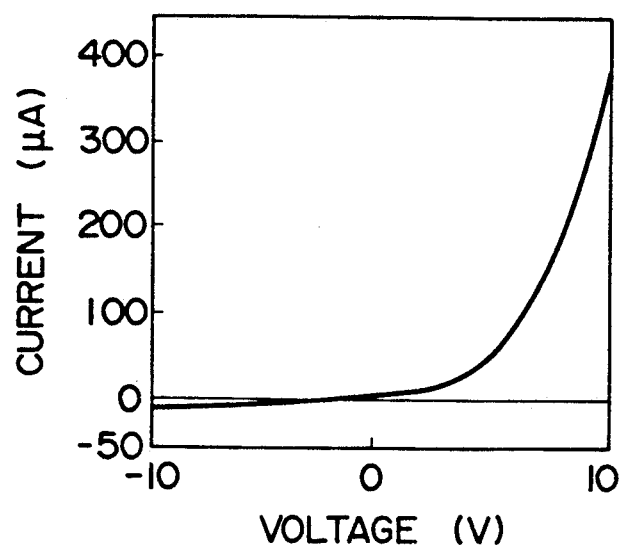
FIG. 10 is a graph showing the I-V characteristic of the Schottky diode of FIG. 9.

The Schottky diode of the present invention may be provided with an Al planar electrode 11 as shown in FIG. 5 instead of the Al needle electrode 10 shown in FIG. 2.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A Schottky diode manufacturing process employing the synthesis of a polycrystalline diamond film, comprising: a deposition of a B-doped p-type polycrystalline diamond film on a low-resistance p-type Si substrate by using a source gas consisting of $CH_4$, $H_2$ and $B_2H_6$ and having boron/carbon concentration ratio greater than 0.01 ppm and less than 20 ppm; forming an ohmic contact on the back of the p-type Si substrate; and forming a metal electrode on the B-doped p-type polycrystalline diamond thin film.

2. A Schottky diode manufacturing process according to claim 1, wherein the metal electrode is formed of a metal chosen from the group consisting of Al, Pt, Au, Ti and W.

3. A Schottky diode manufacturing process employing the synthesis of a polycrystalline diamond film, comprising the steps of:
polishing a surface of a p type silicon substrate with a diamond grit having submicron diamond particles;
placing said substrate in a CVD system;
heating said substrate to 800° C.;
flowing gas consisting of $CH_4$, $H_2$ and $B_2H_6$ through said CVD system, wherein $CH_4$ gas constitutes 0.5 percent of the flowing gas, the ratio of boron to carbon in said gas being between 0.01 and 20, to one million, the gas flow rate being sufficient to maintain the pressure in the system at 31.5 Torr;
igniting a microwave plasma in said CVD chamber;
growing a boron doped diamond film on said surface, for several hours;
forming an ohmic contact on the uncoated surface of said silicon substrate; and
forming a Schottky contact upon said diamond film.

4. A process according to claim 3, wherein said Schottky contact is formed by contacting a needle electrode tip to said diamond film, wherein said needle is formed from an element chosen from the group consisting of Al, Pt, Au, Ti and W.

5. A process according to claim 3, wherein said Schottky contact is formed by preparing a planar electrode on said diamond film, wherein said electrode is formed from a metal chosen from the group consisting of Al, Pt, Au, Ti and W.

* * * * *